(12) United States Patent  
Chellappa et al.

(10) Patent No.: US 9,419,638 B1  
(45) Date of Patent: Aug. 16, 2016

(54) HIGH SPEED COMPARATOR WITH DIGITALLY CALIBRATED THRESHOLD

(71) Applicant: NVIDIA CORPORATION, Santa Clara, CA (US)

(72) Inventors: Balaji Narendran Chellappa, Dallas, TX (US); Paul Aymeric Fontaine, Plano, TX (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 14/727,282

(22) Filed: Jun. 1, 2015

(51) Int. Cl.
*H03M 1/10* (2006.01)
*H03M 1/00* (2006.01)
*H03M 1/34* (2006.01)

(52) U.S. Cl.
CPC ............ *H03M 1/1023* (2013.01); *H03M 1/002* (2013.01); *H03M 1/34* (2013.01)

(58) Field of Classification Search
CPC ...... H03M 1/1023; H03M 1/34; H03M 1/002
USPC ............ 341/118, 120, 155, 158, 159; 327/55, 327/57, 65
See application file for complete search history.

(56) References Cited

U.S. PATENT DOCUMENTS

| | | | | |
|---|---|---|---|---|
| 8,362,934 B2* | 1/2013 | Matsuzawa | .......... | H03K 5/2481 341/118 |
| 8,446,178 B2* | 5/2013 | Pang | .................. | H03F 3/45183 327/307 |
| 8,760,338 B2* | 6/2014 | Danjo | .................... | H03K 5/249 341/155 |
| 8,829,942 B2* | 9/2014 | Chan | ........................ | H03K 5/22 327/65 |
| 8,836,376 B2* | 9/2014 | Danjo | .................. | H03M 1/361 327/55 |
| 8,884,653 B2* | 11/2014 | Inoue | .................. | H03K 5/2481 327/54 |
| 8,890,740 B2* | 11/2014 | Hoshino | .................. | H03L 5/00 341/118 |

* cited by examiner

*Primary Examiner* — Khai M Nguyen
(74) *Attorney, Agent, or Firm* — Artegis Law Group, LLP

(57) ABSTRACT

A subsystem configured to implement an analog to digital converter that includes a high speed comparator with an embedded reference voltage level that functions as a calibrated threshold. A calibration element applies power to a reference voltage system. The calibration element then selects a differential analog voltage and applies the differential analog voltage to the inputs of the comparator. A digitally coded signal then configures an array of switches that connect complements of integrated resistors to each input of the comparator so that the switching point of the comparator occurs coincident with the applied differential analog reference voltage, nulling out the effect of the applied differential analog voltage and comparator errors. The calibration element then removes power from the reference voltage system. As a result, the comparator is configured with an embedded threshold that equals the differential analog reference voltage.

20 Claims, 8 Drawing Sheets

HIGH SPEED COMPARATOR WITH DIGITALLY CALIBRATED THRESHOLD

BACKGROUND OF THE INVENTION

1. Field of the Invention

Embodiments of the present invention relate generally to graphics processing and, more specifically, to a high speed comparator with digitally calibrated threshold.

2. Description of the Related Art

In many applications, computer systems process data that characterizes aspects of the physical world. Parameters of the physical world are inherently continuous and may include considerations such as frequency or volume of an audio tone, intensity of a light signal, or position of a work piece, among many other examples without limitation. Electrical sensors and transducers generate continuous analog signals that represent physical parameters. Accordingly, computer systems employ circuits, termed analog-to-digital converters (ADCs), to translate the continuous analog signals into discrete binary signals that the computer system can process.

ADCs include comparators to quantize the analog signal into elements, or bits, that represent the signal level. A typical comparator has two inputs, one input being the applied signal, and the other input being a reference level. When the input is greater than the reference level, the output is driven to a high logic state. Conversely, when the reference level is greater than the input, the output is driven to a low logic state. Thus, the comparator generates a single bit that provides a one-bit level of resolution of the applied signal. The threshold at which the output changes state characterizes each constituent comparator.

As an illustration, a comparator may have a reference level at the midpoint of the applied signal range. The resulting output indicates whether the applied signal is greater than the midpoint. A second comparator may have a reference level at twenty-five percent of the applied signal range. The resulting output indicates whether the applied signal is greater than twenty-five percent of the applied signal range. Additional comparators with varying reference levels provide an increasing resolution of the digital representation of the applied analog signal. For a computer system that is designed to have a resolution of N thermometer bits, a collection of N comparators form a quantizer that generates an N-bit representation of the applied signal.

A critical parameter of the performance of the quantizer is the linearity of the resultant digital output with respect to the applied analog input. The quantizer is configured such that there is an incremental increase in the threshold of the comparators for each successive bit. The linearity of the quantizer is determined by the matching of all the incremental increases in the thresholds of each constituent comparator.

Conventional ADCs include a pre-amplifier to scale the level of the input to the comparator. Efficient system operation entails a pre-amplifier with speed and bandwidth that is adequate to accommodate the bandwidth of the applied signal. Typical pre-amplifiers for application in ADCs are power hungry, and power usage increases as the required speed increases. Conventional ADCs further include a reference system that generates the required multiple reference levels. The reference system must be continuously powered in order to provide the various levels to all comparators included in the quantizer and is, therefore, an additional source of power usage within the computer system.

One drawback to the above approach is that conventional ADC's that include pre-amplifiers impose a speed restriction on the conversion process due to bandwidth limitation. Additionally, a continuously powered reference system incurs power consumption penalties that burden the overall system power budget. Further, mismatches in the thresholds of comparators limit the performance of the ADC by introducing non-linearity into the system.

As the foregoing illustrates, what is needed in the art is a more power efficient digital comparator.

SUMMARY OF THE INVENTION

One embodiment of the present invention sets forth a method for digitizing analog signals, the method comprising receiving a first reference signal, determining a first threshold based on the first reference signal, storing the first threshold, receiving an analog signal, comparing the analog signal to the first threshold to generate a first bit that represents the analog signal, and outputting the first bit.

At least one advantage of the disclosed approach is that an embedded programmable threshold allows the comparator to function without the need for a reference system or a pre-amplifier, thus reducing power usage and increasing speed of operation. Power is applied to the reference system only for calibration at start-up affording power saving during operation.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

System Overview

Figure 1:
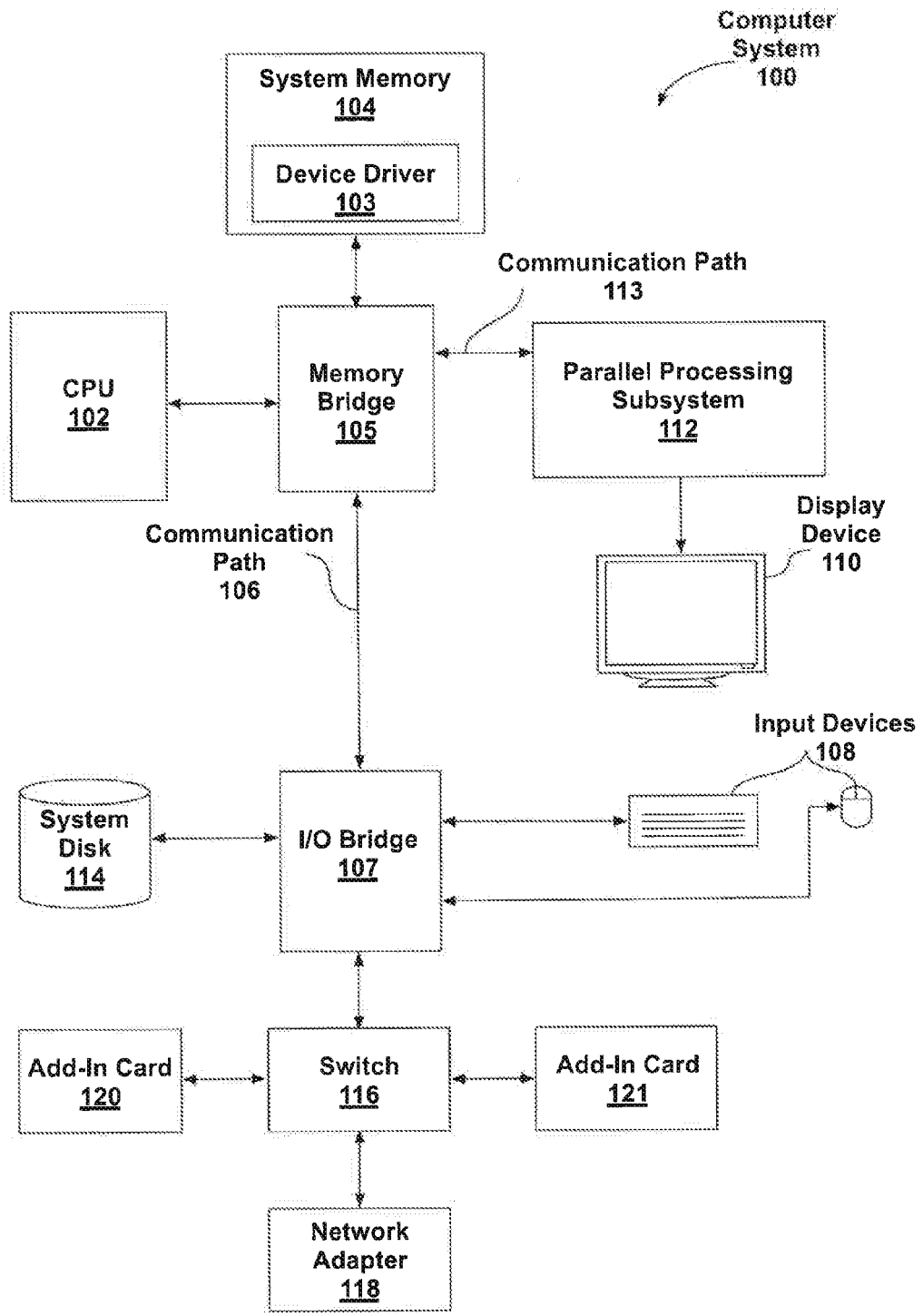
FIG. 1 is a block diagram illustrating a computer system configured to implement one or more aspects of the present invention.

FIG. 1 is a block diagram illustrating a computer system 100 configured to implement one or more aspects of the present invention. As shown, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processing units (PPUs) included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more of the other elements of FIG. 1 to form a single system. For example, parallel processing subsystem 112 may be integrated with CPU 102 and other connection circuitry on a single chip to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
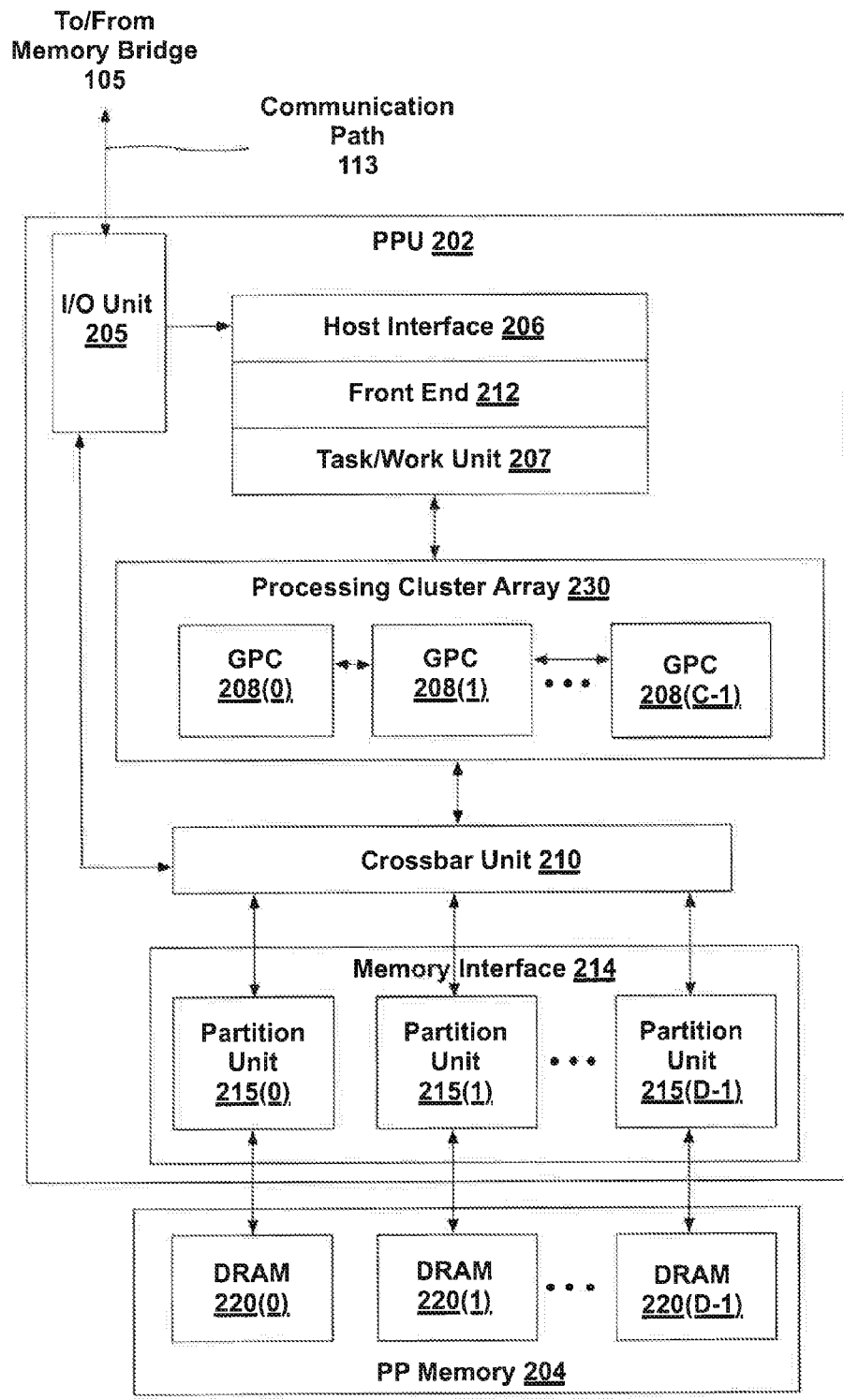
FIG. 2 is a block diagram of a parallel processing unit included in the parallel processing subsystem of FIG. 1, according to one embodiment of the present invention.

FIG. 2 is a block diagram of a parallel processing unit (PPU) 202 included in the parallel processing subsystem 112 of FIG. 1, according to one embodiment of the present invention. Although FIG. 2 depicts one PPU 202, as indicated above, parallel processing subsystem 112 may include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 comprises a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to display device 110 for display. In some embodiments, PPU 202 also may be configured for general-purpose processing and compute operations.

In operation, CPU 102 is the master processor of computer system 100, controlling and coordinating operations of other system components. In particular, CPU 102 issues commands that control the operation of PPU 202. In some embodiments, CPU 102 writes a stream of commands for PPU 202 to a data structure (not explicitly shown in either FIG. 1 or FIG. 2) that may be located in system memory 104, PP memory 204, or another storage location accessible to both CPU 102 and PPU 202. A pointer to the data structure is written to a pushbuffer to initiate processing of the stream of commands in the data structure. The PPU 202 reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

As also shown, PPU 202 includes an I/O (input/output) unit 205 that communicates with the rest of computer system 100 via the communication path 113 and memory bridge 105. I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to PP memory 204) may be directed to a crossbar unit 210. Host interface 206 reads each pushbuffer and transmits the command stream stored in the pushbuffer to a front end 212.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with CPU 102 in a single integrated circuit or system on chip (SoC).

In operation, front end 212 transmits processing tasks received from host interface 206 to a work distribution unit (not shown) within task/work unit 207. The work distribution unit receives pointers to processing tasks that are encoded as task metadata (TMD) and stored in memory. The pointers to TMDs are included in a command stream that is stored as a pushbuffer and received by the front end unit 212 from the host interface 206. Processing tasks that may be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

PPU 202 advantageously implements a highly parallel processing architecture based on a processing cluster array 230 that includes a set of C general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D of partition units 215, where D≥1. Each partition unit 215 is coupled to one or more dynamic random access memories (DRAMs) 220 residing within PPM memory 204. In one embodiment, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

A given GPC 208 may process data to be written to any of the DRAMs 220 within PP memory 204. Crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In one embodiment, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

Again, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including CPU 102, another PPU 202 within parallel processing subsystem 112, or another parallel processing subsystem 112 within computer system 100.

As noted above, any number of PPUs 202 may be included in a parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

High Speed Comparator with Digitally Calibrated Thresholds

Figure 3:
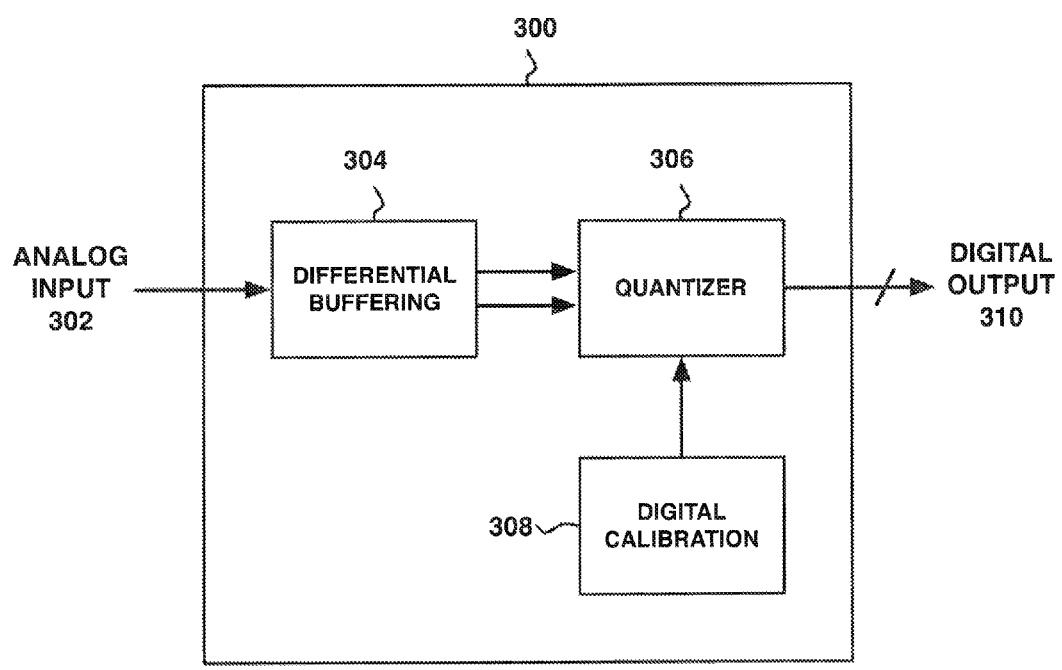
FIG. 3 is a block diagram of an analog to digital converter (ADC), according to one embodiment of the present invention.

FIG. 3 is a block diagram of an analog-to-digital converter (ADC) 300, according to one embodiment of the present invention. ADC 300 includes differential buffering 304, quantizer 306, and digital calibration 308. In operation, differential buffering 304 receives analog input 302 and performs buffering to provide a differential signal to quantizer 306.

As described in greater detail below in conjunction with FIG. 4, quantizer 306 includes multiple comparators, each of which produces an output that gives a single quantization of the differential input. The complement of all the output of the multiple comparators serve to produce digital output 310.

Each comparator includes an inherent input offset that occurs due to unavoidable component mismatches. As described in greater detail below in conjunction with FIG. 4, digital calibration 308 includes a reference system to generate reference voltages and logic to apply binary codes to control the inherent offsets of the comparators included in quantizer 306. Digital calibration 308 generates a unique reference level and manipulates a binary code to produce an internal offset for each of the multiple comparators included in quantizer 306.

ADC 300 may be included in any portion of computer system 100 that interfaces with physical quantities. For example, add-in cards 120 and 121 may include instances of ADC 300 to digitize data relating to motor speed control, video audio recording, voice recognition, or any of a myriad of parameters.

Further, ADC 300 may be included in elements within PPU 202. For example, instances of GPC 208 may include instances of ADO 300 to read the position of a hand held game controller, or of the data encoded in a bar code. Persons skilled in the art will understand that any digital system that processes data related to physical sensors may include instances of ADC 300.

Figure 4:
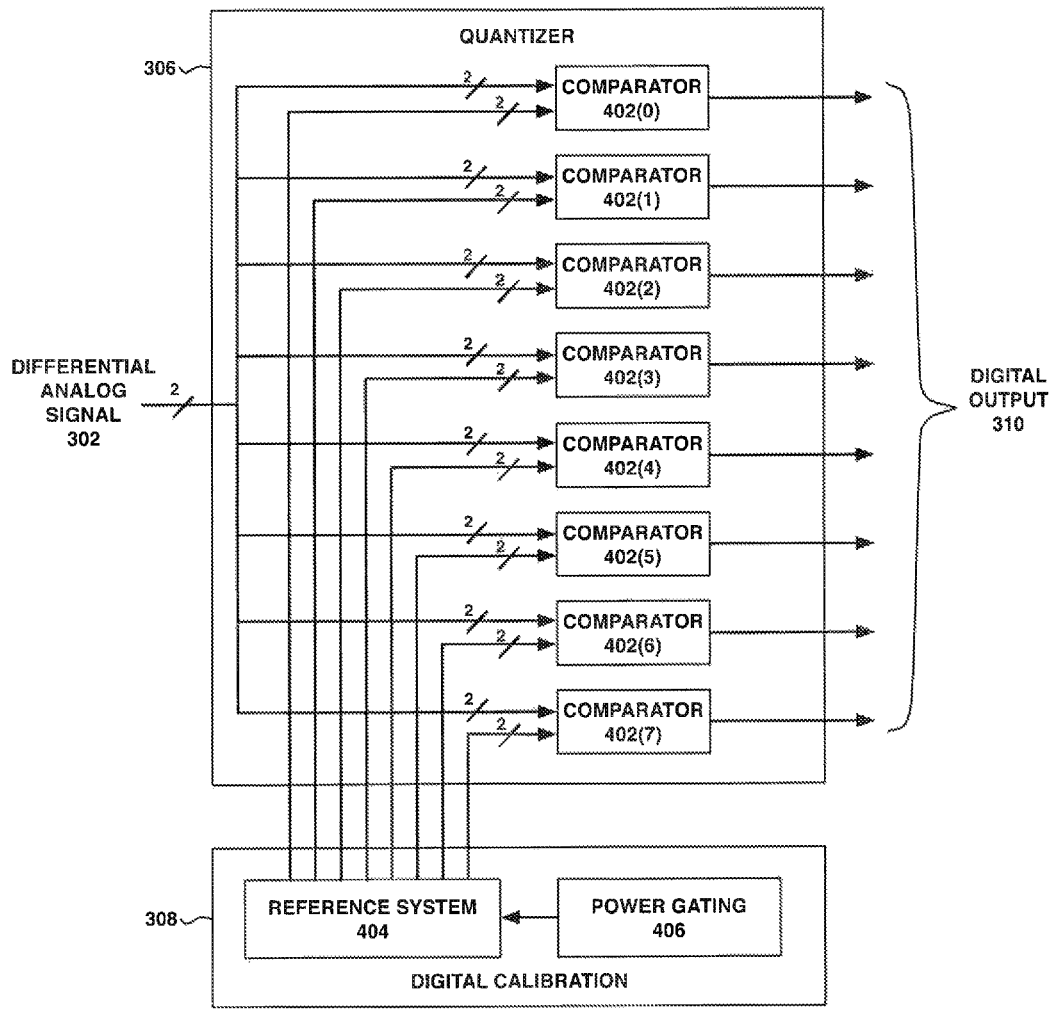
FIG. 4 is a conceptual diagram of a quantizer and reference system configured to calibrate an array of high speed comparators, according to one embodiment of the present invention.

FIG. 4 is a conceptual diagram of a quantizer 306 and digital calibration 308 configured to calibrate an array of high speed comparators, according to one embodiment of the present invention. Quantizer 306 includes a number of comparators 402, each of which include a configurable reference as further described below in conjunction with FIGS. 5 through 7. Quantizer 306 applies differential analog signal 402 to the input of each comparator 402. Further, digital calibration 308 receives unique reference voltages from reference system 404 and applies each of the unique reference voltages to the input of each comparator 402. Quantizer 306 uses the unique reference voltages to determine the level of the configurable reference as further described below in conjunction with FIGS. 5 through 7. One drawback to the above approach is that conventional ADC's that include pre-amplifiers impose a speed restriction on the conversion process due to bandwidth limitation. Additionally, a continuously powered reference system incurs power consumption penalties that burden the overall system power budget.

Digital calibration 308 includes reference system 404 and power gating 406. Reference system 404 generates the unique reference voltages and applies the unique reference voltages to quantizer 306. Quantizer 306 calibrates configurable thresholds as described in detail below in conjunction with FIGS. 5 through 8. When quantizer 306 completes calibration of all configurable thresholds, power gating 406 removes power from reference system 404. The power consumption of digital calibration 308 is then near zero and consists only of dissipation due to quiescent leakage currents.

In computer systems, the number of comparators included in ADCs is typically a power of two. FIG. 4 illustrates a quantizer 306 with eight comparators. Persons skilled in the art will understand that any number of comparators is within the scope of the present invention.

Figure 5:
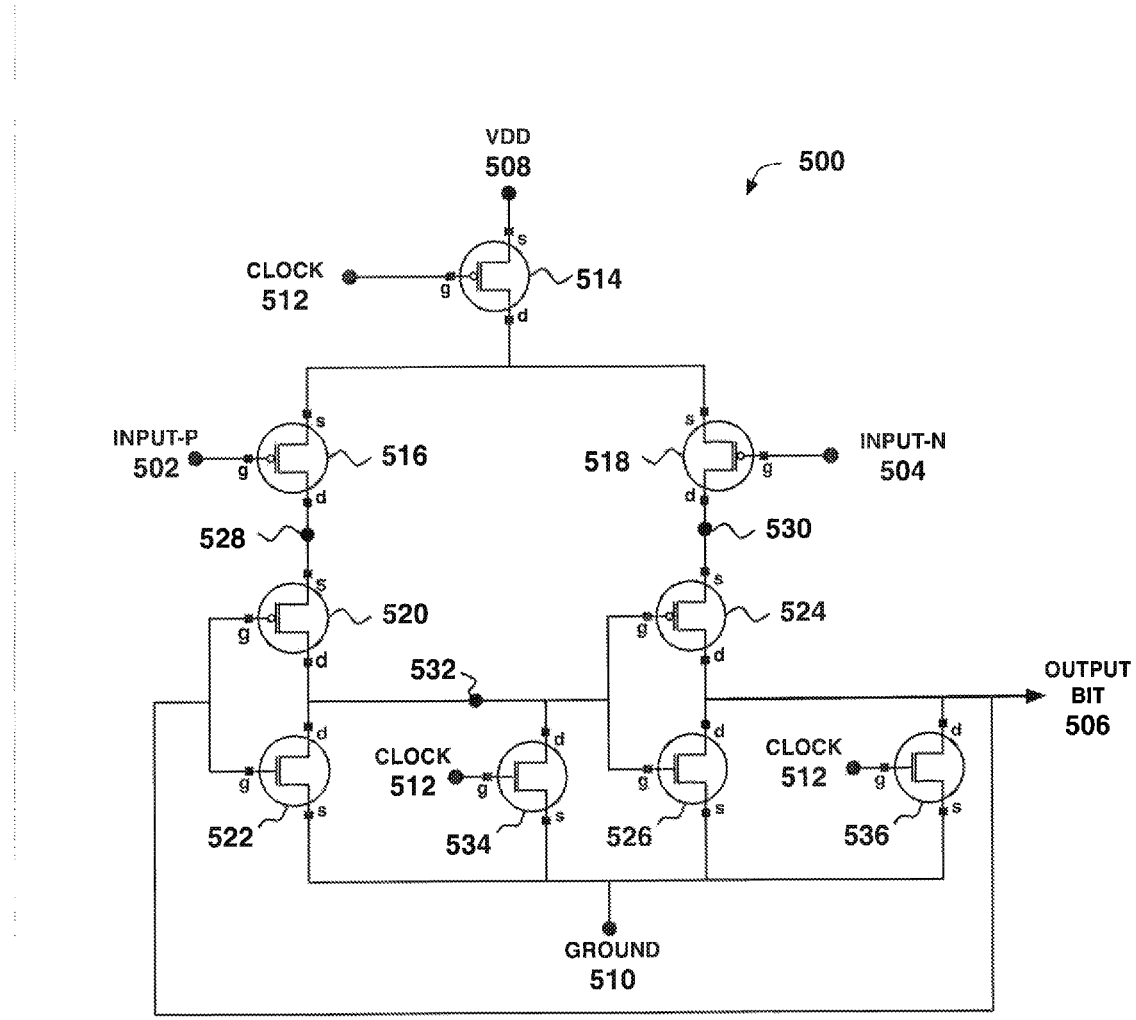
FIG. 5 is a conceptual diagram of a comparator circuit configured to implement a high speed comparison operation, according to one embodiment of the present invention.

FIG. 5 is a conceptual diagram of a comparator circuit 500 configured to implement a high speed comparison operation, according to one embodiment of the present invention. Comparator 500 includes transistors 516, 520, and 522 that form an input gating element. Transistors 518, 524, and 526 form a matched input gating element. Quantizer 306 applies input-p 502 to transistor 516 and further applies input-n 504 to transistor 518. Comparator 500 further includes transistors 514, 534, and 536. Quantizer 306 applies clock 512 to transistors 514, 534, and 536.

In operation, when clock 512 is at a high level, transistor 534 conducts and connects node 532 to ground 510. Further, when clock 512 is at a high level, transistor 536 conducts and connects node 506 to ground 510. This resets the comparator and creates a deterministic starting condition.

When clock 512 transitions to a low level, transistor 514 applies power to the gating element formed by transistors 516, 520, and 522, and to the matched gating element formed by transistors 518, 524, and 526. Further, when clock 512 transitions to a low level, transistors 534 and 536 transition to the non-conducting state and release nodes 532 and 506, respectively. The comparator is then in an operational state.

When input-p 502 is greater than input-n 504, transistor 518 turns on, that is, conducts, and node 530 goes to a high level, near VDD 508. Conversely, transistor 516 turns off, that is, goes non-conducting, leaving node 528 with no voltage source. Node 528, therefore, goes to a low level. Consequently, the gating element formed by transistors 518, 524, and 526 drives output bit 506 to a high voltage level, near VDD 508.

Alternatively, when input-n 504 is greater than input-p 502, transistor 516 turns on, that is, conducts, and node 528 goes to a high level, near VDD 508. Conversely, transistor 518 is off, that is, goes non-conducting, leaving node 530 with no voltage source. Node 530, therefore, goes to a low level. Consequently, the gating element formed by transistors 516, 520, and 522 drives node 532 to a high voltage level, near VDD 508, which then drives transistor 526. Transistor 526 then pulls output bit 506 to a low voltage level, near ground 510. Thus, the difference between input-p 502 and input-n 504 determines the logic state of output bit 506.

In integrated computer systems, particularly in modern sub-micron geometries, mismatches in the area of transistors increase and lead to mismatches in the thresholds at which transitions occur. A mismatch would then alter the relative switching points of transistor 516 and transistor 518. If the switching point of transistor 516 is lower than the switching point of transistor 518, then transistor 524 drives output bit 506 to a high logic state when input-n 504 goes below input-p 502 by more than the difference in the switching thresholds.

If the switching point of transistor 516 is higher than the switching point of transistor 518, then transistor 526 drives output bit 506 to a low logic state when input-p 502 goes below input-n 504 by more than the difference in the switching thresholds. A configurable reference, as described in detail below in conjunction with FIG. 6, compensates for mismatch in either direction.

In one embodiment, node 502 and node 504 are driven, as described in detail below in conjunction with FIG. 6 and FIG. 7, such that difference between the switching point of transistor 516 and the switching point of transistor 518 effectively establishes a threshold in comparator circuit 500.

Figure 6:
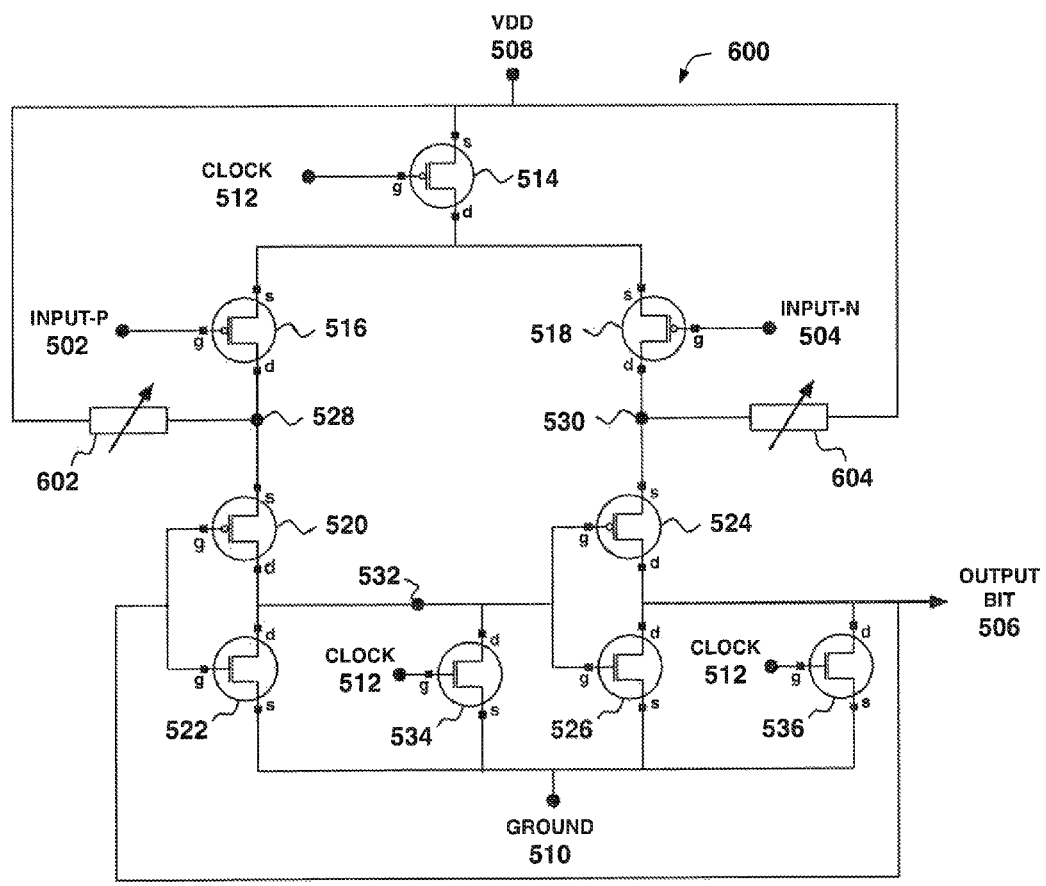
FIG. 6 is a conceptual diagram of a comparator circuit configured to implement an variable differential offset in a high speed comparator, according to one embodiment of the present invention.

FIG. 6 is a conceptual diagram of a comparator circuit 600 configured to implement a variable differential offset in a high speed comparator, according to one embodiment of the present invention. Circuit 600 includes some of the same elements as circuit 500 described above in conjunction with FIG. 5, but further includes variable resistor 602 and variable resistor 604. Variable resistor 602 supplies current to node 528 that, along with the bulk resistances of transistor 520 and transistor 522, serves to alter the voltage level of node 528. Similarly, variable resistor 604 supplies current to node 530 that, along with the bulk resistances of transistor 524 and transistor 526, serves to alter the voltage level of node 530.

By manipulating the values of variable resistor 602 and variable resistor 604, reference system 404 may alter voltage levels of nodes 528 and 530 such that the switching points of transistor 516 and transistor 518 coincide. Thus, reference system 404 may zero out any input offset in the switching thresholds.

Further, by applying a specified differential reference voltage between input-p 502 and input-n 504, reference system 404 may then adjust the values of variable resistor 602 and variable resistor 604 such that the switching points of transistor 516 and transistor 518 again coincide. The values of variable resistor 602 and variable resistor 604 in this manner, then, embed a threshold into the comparator circuit 600 that is equal to the specified differential reference voltage.

Figure 7:
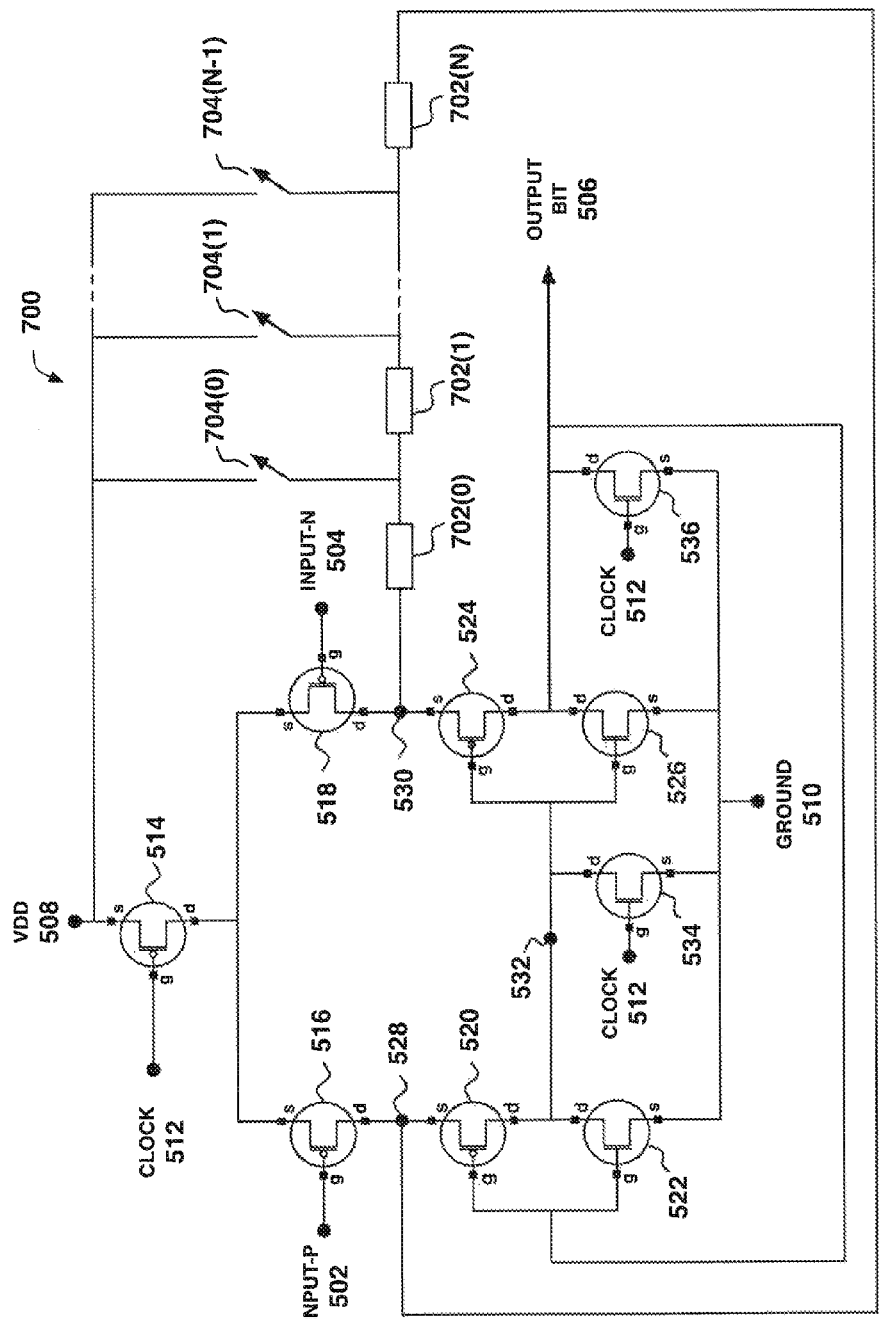
FIG. 7 is a conceptual diagram of a comparator circuit configured to digitally control a differential offset in a high speed comparator, according to one embodiment of the present invention.

FIG. 7 is a conceptual diagram of a comparator circuit 700 configured to digitally control a differential offset in a high speed comparator, according to one embodiment of the present invention. Circuit 700 includes some of the same elements as circuit 500 described above in conjunction with FIG. 6, but further includes a resistor array that includes resistors 702(0) through 702(N). Circuit 700 further includes a switch array that includes switches 704(0) through 704(N−1).

Switches 704 may be configured to states that connect a complement of resistors 702 to node 528 and that connect another complement of resistors 702 to node 530. The complement of resistors 702 connected in this manner to node 528, thus, provides the functionality of variable resistor 602 as described above in conjunction with FIG. 6. Similarly, the complement of resistors 702 connected in this manner to node 530 provides the functionality of variable resistor 604 as described above in conjunction with FIG. 6.

Power gating 406 may configure the complement of resistors 702 connected to node 528 and the complement of resistors 702 connected to node 530 by applying, via reference system 404, a differential voltage between input-p 502 and input-n 504. Power gating 406 may monitor output bit 506 and manipulate the states of switches 704 to determine the switching point of comparator 700. In this manner, the applied differential voltage embeds a threshold into comparator 700.

The number of resistors 702 that may be connected to node 528 and to node 530 determines the accuracy of the embedded threshold, in that a larger the number of steps affords greater resolution. Further, a greater resolution affords improved matching between comparators. Thus, the ADC may attain a level of performance limited only by the number of resistors 702 included in each instance of comparator 700 included in quantizer 306.

Comparator 700 obviates the need for any front end amplifier to scale the applied signal and compensate for offsets. Offsets are cancelled out by including the embedded threshold. Further, comparator 700 minimizes power dissipation, as the system powers the reference system only at power-up for initial calibration.

FIG. 7 illustrates one topology of a resistor array that is configured to alter the thresholds of transistor 516 and transistor 518. Persons skilled in the art will understand that any topology of a resistor array configured to perform the described functionality is within the scope of the present invention.

Figure 8:
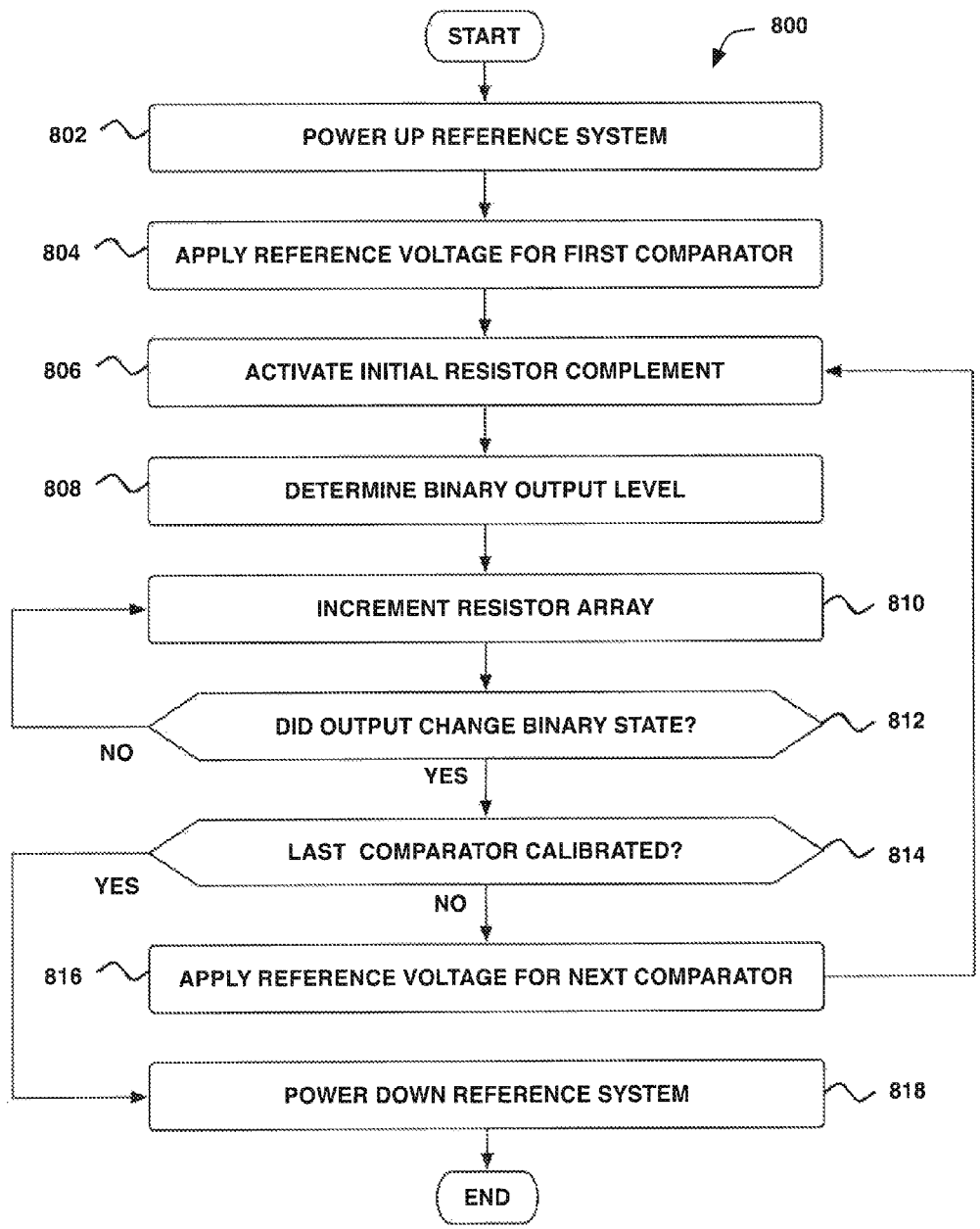
FIG. 8 is a flow diagram of method steps for calibrating the offset of a high speed comparator, according to one embodiment of the present invention.

FIG. 8 is a flow diagram of method steps for calibrating of the offset of a high speed comparator, according to one embodiment of the present invention. Although the method steps are described in conjunction with the systems of FIGS. 1-7, persons skilled in the art will understand that any system configured to perform the method steps, in any order, is within the scope of the present invention.

As shown, method 800 begins at step 802, where power gating 406 powers up reference system 404. At step 804, power gating 406 applies the reference voltage appropriate for the first comparator. At step 806, digital calibration 308 applies the binary code to activate the initial resistor complement in the first comparator. At step 808, digital calibration 308 determines the logic state of the output of the first comparator. At step 810, digital calibration 308 increments the binary code of resistor complement in the first comparator. At step 812, digital calibration 308 determines if the output of the first comparator has changed state due to the incremental change in the resistor binary code.

If, at step 812, digital calibration 308 determines that the output of the first comparator has not changed state due to the incremental change in the resistor binary code, then method 800 returns to step 810. If, at step 812, digital calibration 308 determines that the output of the first comparator has changed state due to the incremental change in the resistor binary code, then method 800 proceeds to step 814. At step 814, digital calibration 308 determines if the prior comparator calibrated is the last comparator.

If, at step 814, digital calibration 308 determines that the prior comparator calibrated is not the last comparator, then method 800 returns to step 806. If, at step 814, digital calibration 308 determines that the prior comparator calibrated is the last comparator, then method 800 proceeds to step 818. At step 818, digital calibration 308 powers down the reference system, thus completing the calibration of all comparators within quantizer 306.

In sum, a subsystem is configured to implement an analog to digital converter that include high speed comparator with an embedded reference voltage level that functions as a calibrated threshold. A calibration element applies power to a reference voltage system. The calibration element then selects a differential analog voltage and applies the differential analog voltage to the inputs of the comparator. A digitally coded signal then configures an array of switches that connect complements of integrated resistors to each input of the comparator so that the switching point of the comparator occurs coincident with the applied differential analog reference voltage, nulling out the effect of the applied differential analog voltage. The calibration element then removes power from the reference voltage system. As a result, the comparator is configured with an embedded threshold that equals the differential analog reference voltage.

One advantage of the subsystems disclosed herein is that the embedded threshold cancels out any input offset voltage. Consequently, there is no need for a front end amplifier to scale the analog input voltage. The speed of the resulting comparator is then unencumbered by bandwidth limitations of analog processing. Further, the subsystem applies power to the reference system only during system power up and thus reduces the overall power consumption of the ADC in the steady state. Finally, the subsystem improves performance of the ADC by specifying the number of resistor stages to assure the desired linearity.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. A computer-implemented method for digitizing analog signals, the method comprising:
   receiving a first reference signal;
   generating a first threshold based on the first reference signal;
   storing the first threshold;
   receiving an analog signal;
   comparing the analog signal to the first threshold to generate a first bit; and
   outputting the first bit, wherein the first bit represents the analog signal.

2. The computer-implemented method of claim 1, wherein receiving the first reference signal comprises:
   receiving a first voltage; and
   receiving a second voltage.

3. The computer-implemented method of claim 2, wherein determining the first threshold comprises determining a difference between the first voltage and the second voltage.

4. The computer-implemented method of claim 1, wherein storing the first threshold comprises;
   applying a first configuration to a circuit element within a comparator, wherein the first configuration represents the first threshold;
   determining that the comparator changes state at the first threshold when the first configuration is applied;
   storing the first configuration in a set of switches within the comparator; and
   causing the set of switches to apply the first configuration to the circuit element.

5. The computer-implemented method of claim 1, further comprising:
   receiving the first reference signal and storing the first threshold during a calibration mode; and
   receiving the analog signal, comparing the analog signal to the first threshold, and outputting the first bit during an operational mode.

6. The computer-implemented method of claim 5, further comprising:
   powering a reference system to produce the first reference signal during the calibration mode;
   transitioning from the calibration mode to the operational mode; and
   removing power from the reference system after storing the first threshold and upon transitioning from the calibration mode.

7. The computer-implemented method of claim 6, further comprising:
   receiving a second reference signal;
   generating a second threshold based on the second reference signal;
   storing the second threshold;
   comparing the analog signal to the second threshold to generate a second bit; and
   outputting the second bit wherein the second bit represents the analog signal.

8. The computer-implemented method of claim 7, further comprising generating a binary number that includes the first bit and the second bit, wherein the binary number comprises a digital representation of the analog signal.

9. A subsystem configured to digitize analog signals, comprising:
   a reference system configured to generate a first reference signal; and
   a first comparator configured to:
      receive the first reference signal from the reference system;
      generate a first threshold based on the first reference signal;
      store the first threshold;
      receive an analog signal;
      compare the analog signal to the first threshold to generate a first bit; and
      output the first bit, wherein the first bit represents the analog signal.

10. The subsystem of claim 9, wherein the first comparator includes:
   a first circuit element configured to receive a first voltage; and
   a second circuit element configured to receive a second voltage, wherein the first reference signal comprises the first voltage and the second voltage.

11. The subsystem of claim 10, wherein the first threshold comprises a difference between the first voltage and the second voltage.

12. The subsystem of claim 9, wherein the first comparator further includes a set of switches, and the first comparator is further configured to:
   apply a first configuration to the set of switches, wherein the first configuration represents the first threshold;
   determine that a set of circuit elements within the first comparator changes state at the first threshold when the first configuration is applied;
   store the first configuration in the set of switches; and
   cause the set of switches to apply the first configuration to the first comparator.

13. The subsystem of claim 9, wherein the first comparator is further configured to:
   receive the first reference signal and store the first threshold during a calibration mode; and
   receive the analog signal, compare the analog signal to the first threshold, and output the first bit during an operational mode.

14. The subsystem of claim 13, wherein the first comparator is further configured to:
   apply power to a reference system to produce the first reference signal during the calibration mode;
   transition from the calibration mode to the operational mode; and
   remove power from the reference system after storing the first threshold and upon transitioning from the calibration mode.

15. The subsystem of claim 14, further comprising:
   a second comparator, configured to:
      receive a second reference signal;
      generate a second threshold based on the second reference signal;
      store the second threshold;
      compare the analog signal to the second threshold to generate a second bit; and
      output the second bit wherein the second bit represents the analog signal.

16. The subsystem of claim 15, wherein the first bit and the second bit comprise a binary number that represents the analog signal.

17. A comparator configured to digitize analog signals, comprising:
   a first circuit element configured to receive a first voltage;
   a second circuit element configured to receive a second voltage;
   a first plurality of circuit elements, configured to:
      determine a first threshold based on the first voltage and the second voltage, and
      store the first threshold; and
   a second plurality of circuit elements, configured to:
      compare an analog signal to the first threshold to generate a first bit, wherein the first bit represents the analog signal.

18. The comparator of claim 17, wherein the first voltage and the second voltage comprise a reference signal generated by a reference system coupled to the comparator.

19. The comparator of claim 17, wherein the first plurality of circuit elements is further configured to:
   apply a first configuration to a set of switches, wherein the first configuration represents the first threshold;
   determine that a state change occurs at the first threshold when the first configuration is applied; and
   store the first configuration in the set of switches.

20. The comparator of claim 17, wherein the first plurality of circuit elements is configured to receive the first reference signal and store the first threshold during a calibration mode, and the second plurality of circuit elements is configured to receive the analog signal, compare the analog signal to the first threshold, and output the first bit during an operational mode.

* * * * *